United States Patent
Stenz et al.

(10) Patent No.: US 7,313,778 B1
(45) Date of Patent: Dec. 25, 2007

(54) METHOD SYSTEM AND APPARATUS FOR FLOORPLANNING PROGRAMMABLE LOGIC DESIGNS

(75) Inventors: Guenter Stenz, Campbell, CA (US); Srinivasan Dasasathyan, Sunnyvale, CA (US); Rajat Aggarwal, Sunnyvale, CA (US); James L. Saunders, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 375 days.

(21) Appl. No.: 10/787,326

(22) Filed: Feb. 26, 2004

(51) Int. Cl.
*G06F 17/50* (2006.01)
(52) U.S. Cl. .............................. 716/17; 716/2; 716/16
(58) Field of Classification Search .................. 716/2, 716/7–11, 16–17
See application file for complete search history.

(56) References Cited

U.S. PATENT DOCUMENTS

| | | | |
|---|---|---|---|
| 6,415,426 B1 * | 7/2002 | Chang et al. ................... | 716/9 |
| 6,457,164 B1 * | 9/2002 | Hwang et al. .................. | 716/8 |
| 6,779,169 B1 * | 8/2004 | Singh et al. ................... | 716/16 |
| 6,817,005 B2 * | 11/2004 | Mason et al. .................. | 716/16 |
| 2005/0183055 A1 * | 8/2005 | Herrera ........................ | 716/17 |

OTHER PUBLICATIONS

Hiroshi Murata et al.; "VLSI Module Placement Based on Rectangle-Packing by the Sequence-Pair"; IEEE Transactions on computer-Aided Design of Integrated Circuits and Systems; vol. 15, No. 2; Dec. 1996; pp. 1518-1524.
S. Kirkpatrick et al.; "Optimization by Simulated Annealing"; Science; vol. 220, No. 4598; May 13, 1983; pp. 671-680.
Dieter Jungnickel; *Graphs, Networks and Algorithms*; "Algorithms and Computation in Mathematics"; Chapter 13—Weighted Matchings; vol. 5; Copyright 1999; published by Springer-Verlag Berlin Heidelberg New York; pp. 389-401.

* cited by examiner

*Primary Examiner*—Vuthe Siek
(74) *Attorney, Agent, or Firm*—Pablo Meles; Kevin T. Cuenot

(57) ABSTRACT

A method (600) of designing a programmable logic device can include the steps of identifying a cost function that penalizes floorplans of a circuit design that do not fit on the programmable logic device (605) and defining modules having components of a same type (615). A set of shapes associated with a module can be determined (610). The circuit design can be annealed (620) to determine a floorplan using the cost function and the set of shapes for the module.

27 Claims, 5 Drawing Sheets

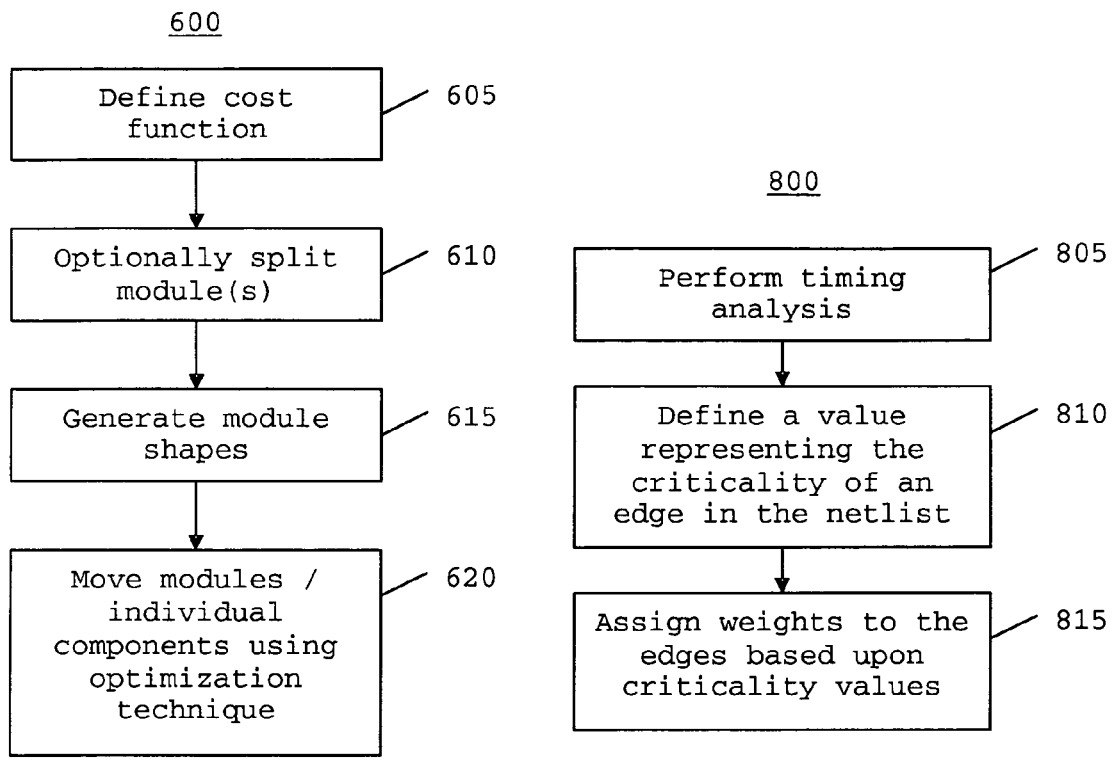
FIG. 6
FIG. 8
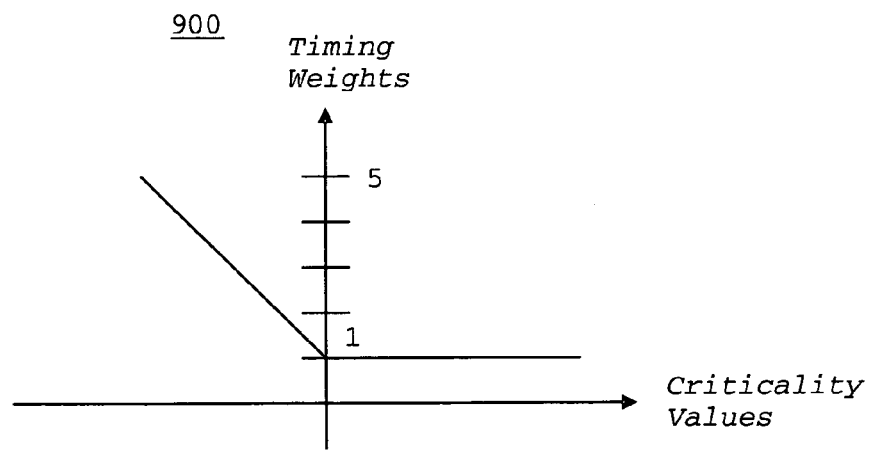
FIG. 9

METHOD SYSTEM AND APPARATUS FOR FLOORPLANNING PROGRAMMABLE LOGIC DESIGNS

BACKGROUND

1. Field of the Invention

The invention relates to the field of circuit design and, more particularly, to floorplanning techniques for Programmable Logic Devices (PLD's).

2. Description of the Related Art

Floorplanning is the first step in generating a placement for a Very Large Scale Integrated (VLSI) circuit design. The task of floorplanning is to generate an overlap-free placement of a set of modules subject to optimization criteria such as net length and path delays. The generated floorplan guides the subsequent placement step in the PLD design process.

Floorplanning operates on a contracted netlist that contains the modules and the consolidated connectivity between the various associated components forming the modules. A net exists between a set of modules if one or more nets exist in the original netlist that connect components which are part of these modules. Every net in the contracted netlist can be assigned a weight, which corresponds to the number of nets in the original netlist which that net represents.

In illustration, FIG. 1 is a schematic diagram illustrating a netlist 100 corresponding to a PLD such as a Field Programmable Gate Array (FPGA). The device has 10 components $C_1, \ldots, C_{10}$. Related components have been grouped into three modules, $M_1$, $M_2$, and $M_3$. The contracted netlist is shown in bold. As shown, there are two nets connecting components in modules $M_1$ and $M_2$ and one net connecting components in modules $M_1$ and $M_3$. Consequently, the netlist representation shown in FIG. 1 contains a net of weight 2 between modules $M_1$ and $M_2$ and a net of weight 1 between modules $M_1$ and $M_3$.

Modules can be represented during the floorplanning process as sequence pairs. Generally, a sequence pair is a one-dimensional, computational model of two-dimensional modules and the associated components of each module. A sequence pair $SP_i$ can include two strings, where each is a perturbation of all k modules of the design. Two exemplary sequence pairs of the netlist in FIG. 1 can be $SP_0=((M_3, M_2, M_1), (M_2, M_1, M_3))$ or $SP_1=((M_1, M_1, M_3), (M_3, M_1, M_2))$. There is a 1:1 relationship between a sequence pair and a floorplan with well defined methods to generate a floorplan from a sequence pair and vice versa.

An iterative optimization technique can be applied to the PLD using the sequence pair representation. The optimization technique can begin with a random solution, such as a random sequence pair, and start swapping modules between one of the two sequences in the sequence pair. The optimization process can continue until one or more of a plurality of design criteria have been achieved.

As shown in FIG. 1, conventional floorplanning techniques utilize modules having a single predefined shape. Contrary to Application Specific Integrated Circuits (ASIC's), floorplanning of FPGA devices requires determining non-overlapping locations for these fixed-shape modules within the fixed area constraints of the FPGA device. Thus, modules $M_1$, $M_2$, and $M_3$ have been located within a cell 105 of a FPGA device having a fixed area.

Although modern FPGA designs can include a variety of different components of varying sizes including, but not limited to, registers, block random access memory (RAM), multipliers, processors, and the like, each component must be placed within a fixed-size module and located on the FPGA device. This is the case despite the heterogeneity of the components and component sizes. Accordingly, although area requirements of a module can vary with the type of components located within that module, designers are limited to using a fixed-shape module despite the heterogeneity of the components located therein.

What is needed is an improved methodology for performing floorplanning with respect to PLD designs.

SUMMARY OF THE INVENTION

The present invention provides a solution for floorplanning a PLD such as a FPGA. The present invention addresses the specific needs of such PLD's. In particular, the present invention provides varied shapes for each module to accommodate the fixed area constraints of PLD's. Varied module shapes further accommodate the heterogeneity of components used within modern PLD designs. The present invention also accounts for congestion and timing requirements of PLD designs.

One embodiment of the present invention can include a method of designing a PLD. The method can include identifying a cost function that penalizes floorplans of a circuit design that do not fit on the PLD, such as a FPGA, and defining modules having components of a same type. The method also can include determining a set of shapes associated with one or more modules and annealing the circuit design to determine a floorplan using the cost function and the set of shapes for one or more of the modules.

In another embodiment, the defining step can include splitting modules into sub-modules such that at least one of the sub-modules consists of components of a same type. Notably, each shape of a set of shapes associated with a module can have a minimum width and height of at least a width and height of a largest relatively placed module to be placed within that module.

In still another embodiment, the annealing step can include assigning modules to a particular one of the set of shapes associated with that module. The annealing step also can include assigning modules and assigned shapes to locations on the physical device as well as using bipartite matching of individual components.

Additionally, the annealing step can include at least one of swapping locations of components of a same type that have associated grid sites, swapping two modules in a sequence pair, and switching the shape of a module from one shape in the set of shapes associated with that module to another.

In yet another embodiment of the present invention, the method can include identifying modules that share a timing critical path and moving identified modules closer to one another. The method also can include generating a flat placement flow for the circuit design and comparing the annealed circuit design with the flat placement flow to determine a measure of quality for the determined floorplan.

Other embodiments of the present invention can include a system for performing and a machine readable storage for causing a machine to perform the steps disclosed herein.

BRIEF DESCRIPTION OF THE DRAWINGS

There are shown in the drawings, embodiments which are presently preferred, it being understood, however, that the invention is not limited to the precise arrangements and instrumentalities shown.

FIG. 6 is a flow chart illustrating a method of floorplanning a FPGA design in accordance with one embodiment of the present invention.

FIG. 8 is a flow chart illustrating a method of assigning timing weights to edges in accordance with yet another embodiment of the present invention.

FIG. 9 is a chart illustrating timing weight dependence of criticality values of edges in accordance with the inventive arrangements disclosed herein.

DETAILED DESCRIPTION OF THE INVENTION

The present invention provides a method, system, and apparatus for floorplanning a PLD design which accounts for specific needs of such devices. The present invention can dynamically determine a set of one or more rectangular, module shapes to be used during the floorplanning process, thereby accommodating the heterogeneity of components and fixed area constraints of PLD's such as FPGA devices.

Figure 1:
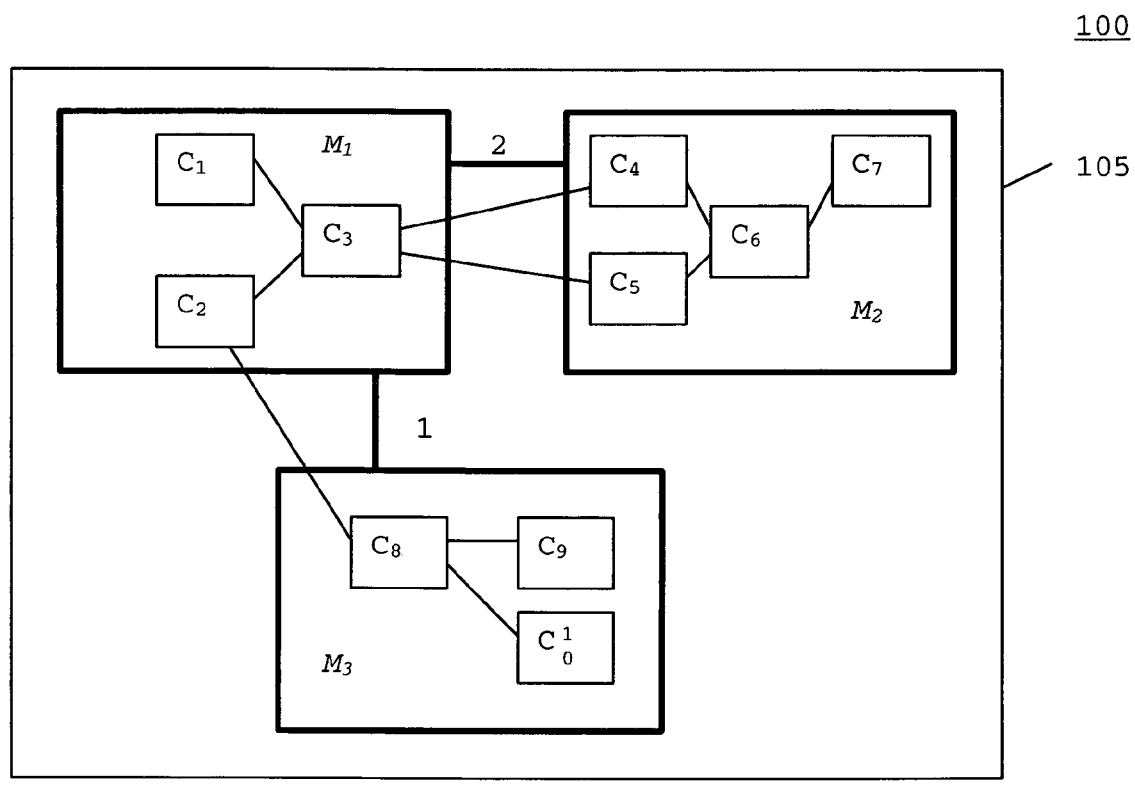
FIG. 1 is a schematic diagram illustrating a graphical representation of an exemplary netlist.
Figure 2:
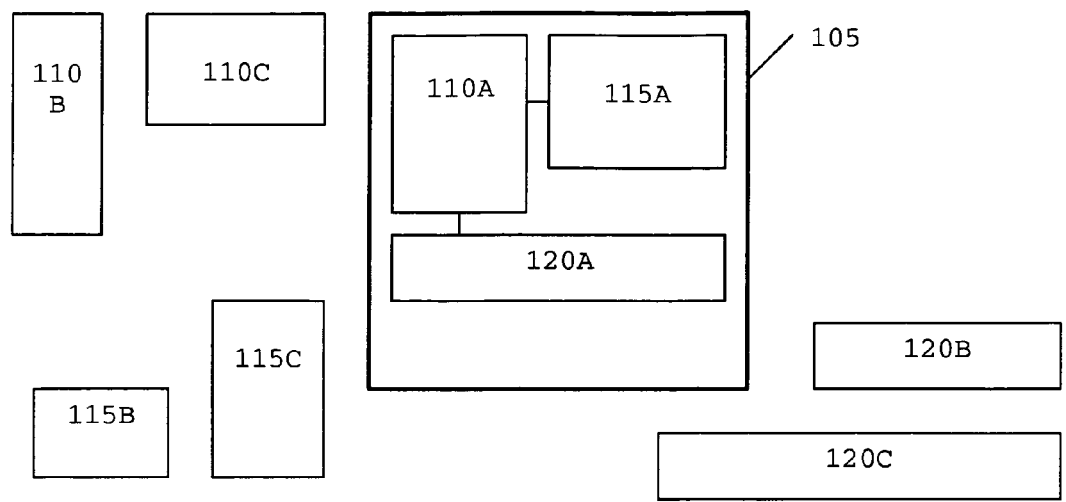
FIGS. 2-5, taken together, are schematic diagrams illustrating one embodiment of the present invention where modules have been associated with sets of shapes.
Figure 3:
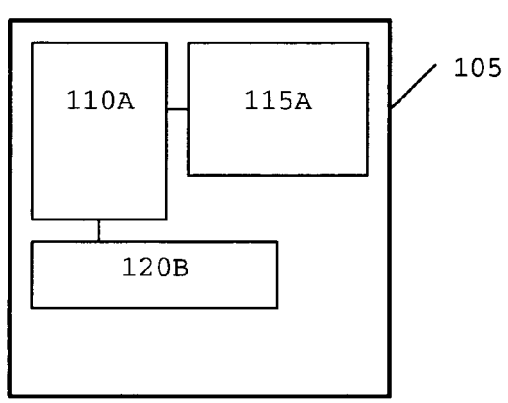
Figure 4:
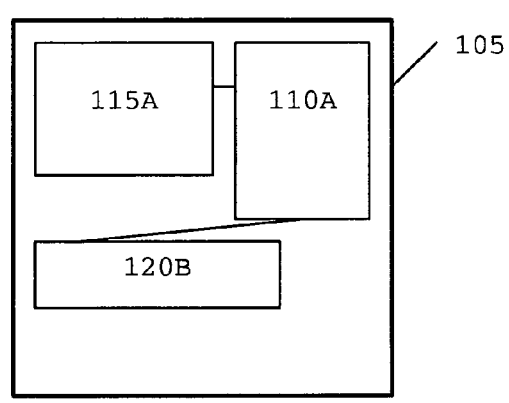

FIGS. 2-4, taken collectively, are schematic diagrams illustrating one embodiment of the present invention. The figures represent the case where modules 110, 115, and 120, each containing selected components, are to be located within a cell 105 of a PLD such as a FPGA. As shown in FIG. 2, rather than utilize a single shape for each module, a plurality of possible shapes have been generated for each of modules 110, 115, and 120. A particular shape from the set of shapes can be selected for each module during the floorplanning process. Thus, module 110 has three associated shapes 110A, 110B, and 110C. Module 115 has three associated shapes 115A, 115B, and 115C, and module 120 also has three associated shapes 120A, 120B, and 120C.

Each possible shape for a module can have a specific width and height in which the components associated with that module can be placed. The widths and heights for each module can be independent of the other modules. Further, it should be appreciated that the number of alternative or possible shapes generated for each module can vary. As such, the present invention is not limited to the use of any particular number of alternative shapes for modules.

FIG. 2 illustrates cell 105 after a preliminary floorplanning has been performed. One shape from the set of shapes for each module has been selected and located within cell 105. Thus, cell 105 includes version "A" of each module. Each module is placed in cell 105 in a non-overlapping fashion.

In FIG. 3, a simulated annealing process has been initiated. Simulated annealing is one variety of stochastic hill-climber algorithms inspired through an analogy with the cooling of metals. Simulated annealing begins with a simulated high temperature and begins randomly generating placement solutions by relocating one or more components or modules, or swapping the position of two or more components or modules. After each swap or iteration, a cost function can be calculated in light of the new placement to evaluate the proposed solution.

If the cost function decreases, indicating that the proposed solution has improved over the last iteration, the solution can be accepted as the current solution and used as a basis for subsequent annealing iterations. If, however, the cost function increases, the solution may or may not be accepted. Specifically, placement solutions producing increasing cost functions can be accepted as the current solution according to a probability that is dependent upon the current value of the temperature.

The probability of accepting a proposed solution showing an increase in a cost function decreases as the temperature decreases during the annealing process. The annealing process incorporates a cooling schedule, or rate of decrease of temperature, such that at high temperatures, almost any proposed placement solution is accepted. Accordingly, at high temperatures, the exploration of different placement solutions is stressed. At lower temperatures, the probability of accepting a solution in which the cost function increases is lessened. Thus, at lower temperatures, the convergence to a particular solution is stressed over exploration of different placement solutions.

Accordingly, as shown in FIG. 3, within a first iteration of the simulated annealing process, module 120A has been replaced with alternative module 120B having a different shape. As noted, a cost function which seeks to minimize net length and path delays can be calculated to evaluate the generated placement.

FIG. 4 depicts a next iteration of the simulated annealing process where the locations of modules 110A and 115A have been switched. The cost function can be calculated again to evaluate the generated placement. The cost function will disfavor the increased net length existing between module 110A and module 120B in cell 105.

Figure 5:
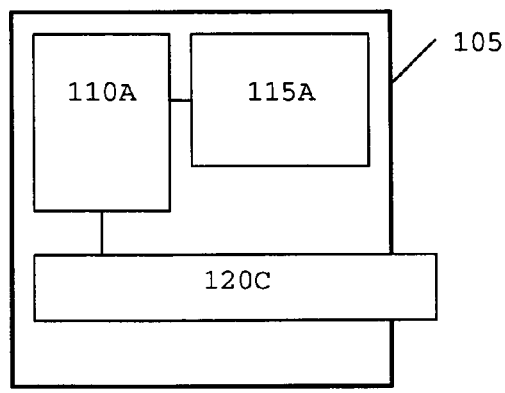

FIG. 5 depicts another possible iteration of the simulated annealing process continuing from FIG. 3. In FIG. 5, module 120B has been replaced with alternative module shape 120C. FIG. 5 illustrates the case where the resulting module placement exceeds the fixed area of cell 105, and is therefore an infeasible placement.

FIG. 6 is a flow chart 600 illustrating a method of floorplanning an PLD design in accordance with one embodiment of the present invention. The method 600 can begin in step 605 where a cost function is defined or identified. The cost function can include a parameter that penalizes floorplans that do not fit onto the physical device to which the PLD design is to be applied.

In one embodiment, the cost function can be implemented as $K=W(1+O/100)$, where W is the weighted wire length and O is the percentage of total module area that is outside of the device. W can be the sum of all netlengths. To determine the length of a net, any of several different models can be used such as the half perimeter of the smallest rectangle that encloses all pins connected to the net. The length of a net can be weighted by a timing weight. By default, the timing weights can be set equal to 1. If a net is considered to be part of a timing critical path, a higher timing weight can be used for the net. The variable O, as noted, can be the percentage of the total module area that is outside of the device which can be easily determined for a given floorplan. In addition, the floorplan with the smallest wire length that completely fits onto the device can be stored for subsequent use.

It should be appreciated, however, that other cost functions can be used. In one embodiment, as noted, the cost function can include measures of path delay.

In step 610, one or more of the modules optionally can be split. A module can be split into multiple sub-modules such that each sub-module contains the components of a particular type from the module. Thus, in one embodiment, a module having components of n different component types can be split into n sub-modules. Still, in another embodiment, the resulting sub-modules can include components of more than one type. Where sub-modules include components of more than one type, components of different types can be placed on the device on separate site grid locations. In that case, two sub-modules that contain components of different types may overlap.

As noted, a sequence pair is a one-dimensional, computational model of a two-dimensional module and its associated components. Accordingly, in the embodiment where modules are split, multiple sequence pairs can be used, where each sequence pair contains modules having components of a specific type such as slices, block-RAM's, multipliers, and the like. It should be appreciated that component types or types, as used herein, can correspond to any kind of component found on a PLD or FPGA, such as Digital Signal Processing (DSP) blocks, flip flops, slices, block-RAM's, multipliers, Lookup Tables (LUT's) and the like. Accordingly, a move in the annealing process can randomly modify the contents of a module, for example by modifying sequence pairs.

The cost of the generated floorplan can be computed including all modules. In general, the sub-modules that have been created for different component types from a single module can be placed close to one another as, in general, those modules have high connectivity. Otherwise, additional "artificial" nets may be introduced that hold together the sub-modules originating from a single module.

In step 615, one or more module shapes can be generated. In particular, for each module, or for selected modules, of the PLD design, a set of shapes can be determined. During simulated annealing, a particular shape from the set of shapes corresponding to a module can be applied or assigned to that module. Thus, each module is assigned a particular shape from a set of shapes determined according to the specific requirements of that module.

In generating module shapes, several parameters can be considered. The rectangular area of the module shape can provide at least as many sites as there are components in the module. Components also can be part of relatively placed modules (RPM's). An RPM is a set of components with predetermined relative coordinates among one another. The components of an RPM are located within the same module. As such, the largest width and height of an RPM assigned to a module constitute a minimum width and height for all shapes generated for a module. Also, depending on the utilization of the PLD, surplus sites within a shape of a module can be provided so as to alleviate congestion.

In step 620, components and/or modules in the PLD design can be moved using simulated annealing or another optimization technique. The cost function defined in step 605 can be used to evaluate the progress of the simulated annealing process. For example, the simulated annealing process can continue for a predetermined number of iterations or until a solution is found such that the cost function yields a particular value or a value within a designated range.

In general, most of the components in a PLD, and more particularly a FPGA design, are slices, or equivalents thereof, that contain LUT's and flip flops. In addition to slices, a much smaller number of components exist of types such as block RAM's, multipliers, and the like, which have an associated grid location on the PLD in which the component is to be placed. Because the number of components having associated grid locations is relatively small, these components can be extracted from their associated module and moved individually during the simulated annealing process.

During simulated annealing, a move can be chosen randomly between a swap of two modules in a sequence pair, the switch of a shape of a module, or the swap of two components of the same type. Similar to the case where modules are split into sub-modules, "artificial" nets or additional costs may be introduced to keep any extracted single components close to the module from which the component was extracted.

In another embodiment of the present invention, individual components can be placed using bipartite matching. Bipartite matching refers to a method of finding a minimum cost when assigning objects to locations. In regular intervals of, for example, 2500 accepted moves in the annealing process, the sites for all single components of the same type can be recomputed using bipartite matching. As there is little connectivity among block-RAM's and multipliers, bipartite matching can be applied. The cost for assigning a component having an associated grid location to a certain site is the sum of all lengths of all nets connected to that component were the component to be placed at that site. The net length can be estimated with standard models including, but not limited to, half perimeter of the smallest rectangle enclosing all pins of the net.

The cost function can favor the movement of individual modules closer to one another to accommodate timing considerations of the FPGA design. More particularly, modules that are connected through timing critical paths can be moved closer to one another. Thus, modules that are connected through timing critical paths, for example modules having edges with particular weight values or values within a particular range, can be moved closer to one another during the simulated annealing process.

Figure 7A:
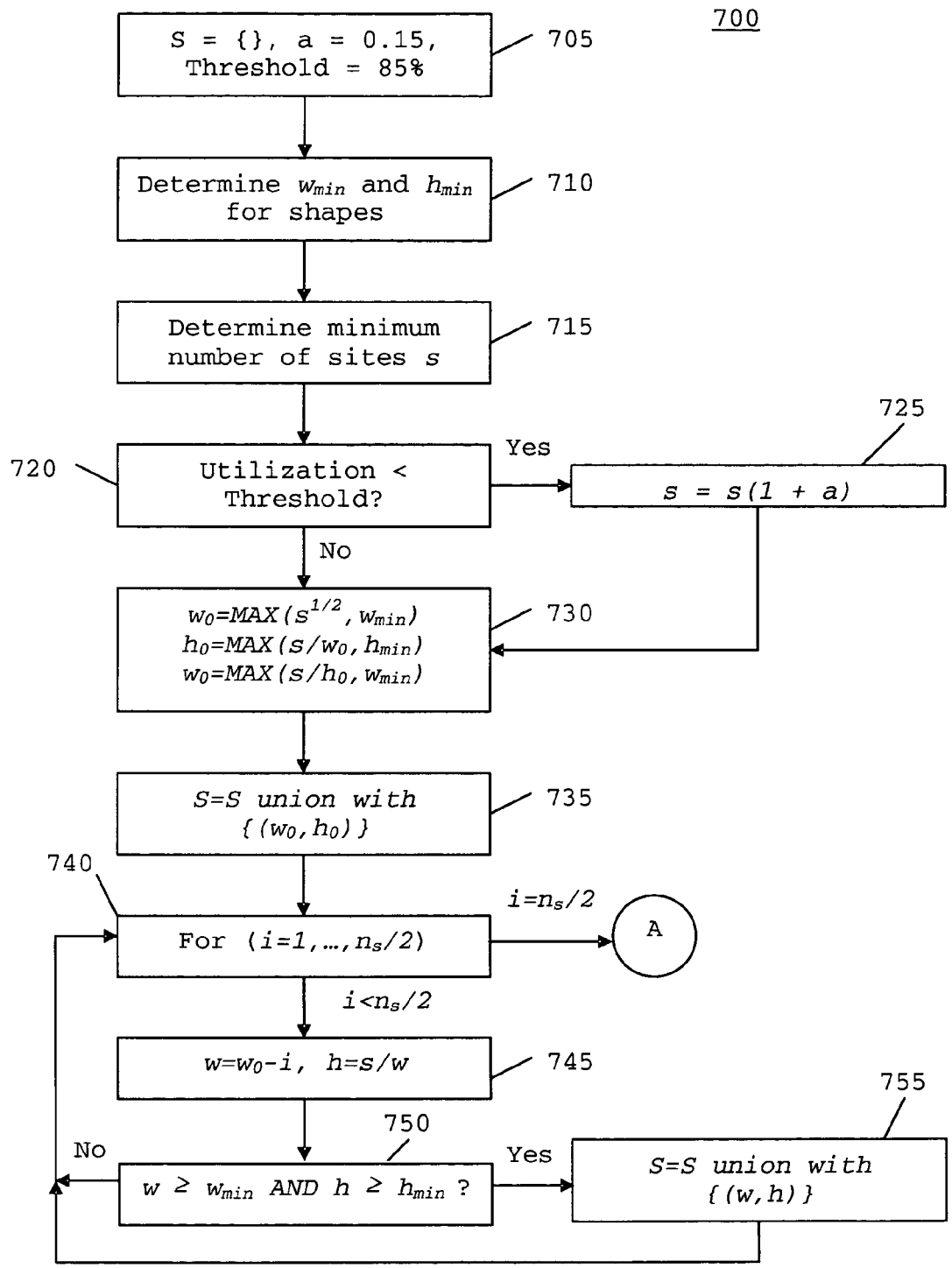
FIGS. 7A and 7B, taken together, form a flow chart illustrating a method of determining module shapes in accordance with another embodiment of the present invention.
Figure 7B:
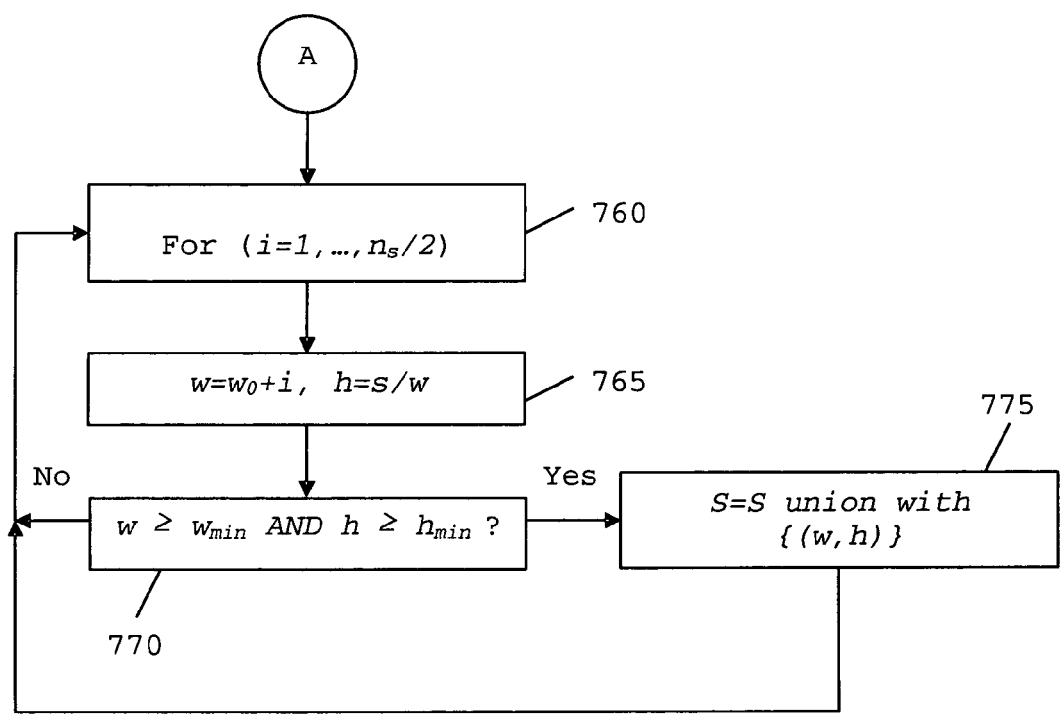

FIGS. 7A and 7B, taken together, form a flow chart illustrating a method 700 of determining module shapes in accordance with another embodiment of the present invention. More particularly, method 700 illustrates a technique for determining a set of shapes for a set of components of the same type that are part of a module. As such, method 700 provides one embodiment of a method that can be used as step 615 of FIG. 6. The set of components P and the desired number of shapes $n_s$ are provided as inputs to method 700.

Accordingly, method 700 can begin in FIG. 7A in step 705 where an output set of determined rectangular shapes denoted as "S" can be defined. An incremental value of 0.15 can be assigned to the variable "a" and a "threshold" can be set equal to 85%. It should be appreciated, however, that the particular values of "a" and "threshold" can be adjusted as may be desired. Accordingly, the present invention is not limited to the use of one particular value for either the incremental value "a" or the threshold.

In step 710, the minimum width $w_{min}$ and height $h_{min}$ of a shape can be computed from the maximum dimensions of the RPM's that are assigned to the module for which a set of shapes "S" is being determined. In step 715, a minimum number of sites "s" can be determined. The minimum number of sites "s" required in all generated shapes can be set equal to the number of components assigned to the module.

In step 720, a determination can be made as to whether the utilization of the module is less than the threshold. If so, the method can proceed to step 725, where the number of sites "s" is increased by a factor of "1+a". This increase in the number of provided sites can avoid the generation of highly congested areas on the device. If the utilization of the module is not less than the threshold, the method can proceed to step 730.

Based on the number of required sites "s", a quadratic shape of width $w_0$ and height $h_0$ can be computed in step 730 and added to the array "S" in step 735. Due to the minimum width and height requirements of shapes, this shape may not be exactly or substantially quadratic. The loop specified by steps 740, 745, 750, and 755 can compute $(n_s/2-1)$ shapes with consecutively decreasing widths and increasing heights so that the shapes provide the desired number of sites "s". If a shape meets the minimum size requirements in step 750, that shape is added to the array "S" in step 755. Once the conditions specified in step 740 and 750 are satisfied, the method can proceed to step 760 in FIG. 7B.

The loop specified by steps 760, 765, 770, and 775 can compute shapes of consecutively increasing widths and decreasing heights. These shapes are added to the array "S" if they meet the minimum size requirements defined in step 770. Notably, the method 700 can be repeated for each module, or for selected modules, of the PLD design.

In addition to minimizing net length, modules that are connected through timing critical paths should be moved close to each other. This can be achieved by giving a higher weight to edges in the netlist that are part of critical paths. FIG. 8 is a flow chart illustrating a method 800 of assigning timing weights to edges in accordance with one embodiment of the present invention. The timing weights can be incorporated into the cost function used during the simulated annealing process to favor the relocation of modules connected through timing critical paths closer to one another.

For timing purposes, modeling the netlist connectivity using edges rather than nets can be beneficial. When representing connectivity using a set of edges, each edge can represent a connection from a source component to a load component. The derived floorplan netlist contains an edge between two modules if there is at least one edge in the original netlist connecting components of these two modules. As an edge weight is based on the timing criticality of a edge, an edge weight provides a measure as to the number of critical connections associated with an edge as well as a degree of criticality for the edge.

The criticality for each connection of an edge can be quantified in terms of the slack, or the degree to which the connection is missing its target delay time. Generally, the edge weight of an edge can include a summing of slacks for each connection associated with the edge. The edge weight can be proportional to the amount by which the respective connections of an edge exceed the target delay for each connection.

In any case, it should be appreciated that netlist connectivity also can be modeled using nets.

The typical objective of floorplanning is to minimize the sum of the weighted net lengths of a netlist. Net lengths can be modeled with any of the regularly used net models as disclosed herein. Also, for purposes of analysis, the pin of a net in a netlist can be considered to be located in the center of its respective module.

The method 800 can begin in step 805 where a timing analysis can be performed to identify potential timing critical paths within the PLD design. In one embodiment of the present invention, the timing analysis can be performed on the unplaced PLD design taking only logic delays and rough net delay estimates into account. In another embodiment of the present invention, a quick placement can be generated, for example with analytical placement techniques, so that the timing analysis can be based on more accurate net delay estimates.

Despite the particular type of timing analysis performed, slack values can be assigned to all edges of the netlist. The smaller the slack value of a connection, the more critical the connection. If the slack value is negative, the connection is part of a path that violates a timing requirement. The shortening of critical paths can be achieved by giving a higher weight to edges in the netlist that are part of critical paths.

Accordingly, in step 810, a value can be defined that represents the criticality of an edge in the netlist. In step 815, weights can be assigned to the edges based on the criticality value of each edge. The criticality of an edge in the floorplan netlist is a function of the slacks of all edges in the original netlist that are represented by an edge. Suitable functions for determining the criticality of an edge can include, but are not limited to, the minimum or the sum of all negative slacks.

FIG. 9 is a chart 900 illustrating timing weight dependence of criticality values of edges in accordance with the inventive arrangements disclosed herein. In particular, chart 900 illustrates one embodiment of how timing weights can be obtained from criticality values. According to one embodiment, timing weights can be multiplied by the existing edge weights. In another embodiment, the timing weights can be added to the existing edge weights.

Once the PLD design has been floorplanned, the resulting design can be compared with a flat placement flow to evaluate the quality of the floorplanned PLD. When comparing the placement quality of a floorplanned PLD against a flat placement flow, for example in terms of highest reachable operational frequency, the result of the comparison depends upon the quality of the floorplanning technique as well as how well components are grouped together into modules.

A comparison of the floorplanned PLD can include generating a flat placement of a design with the best available placement technique. The device area can be covered by a grid of $p=p_1*p_2$ rectangles. The set of components placed within each of the rectangles can be grouped together forming a module which gives p modules. This technique provides a method of partitioning the components that is compatible with a good placement. A good floorplanning technique can produce a floorplan that resembles the original flatly generated placement which may be the best possible floorplan for the given modules. This comparison can provide a measure of quality for the floorplanned PLD design.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of designing a programmable logic device comprising the steps of:
    defining modules of a circuit design comprising components of a same type;
    prior to annealing the circuit design, determining a set of static shapes for each module, wherein each shape of the set of static shapes for each module is sized so that utilization of sites within the shape by components of the module associated with the shape is less than a threshold utilization;
    annealing the circuit design to determine a floorplan by, at least in part,
        for each module during a first iteration of annealing, selecting a shape from the set of static shapes associated with the module and applying the selected shape to the module; and
        for at least one module during at least one further iteration of annealing, selecting a different shape from the set of static shapes associated with the at least one module and applying the different shape to the at least one module, wherein each iteration of annealing the circuit design is evaluated according to evaluation of a cost function.

2. The method of claim 1, said determining step further comprising increasing a minimum number of sites of each shape of the set of static shapes for each module according to a scaling factor.

3. The method of claim 1, said annealing step further comprising evaluating a cost function that depends upon a measure of weighted wire length and a percentage of total module area that is outside of the programmable logic device.

4. The method of claim 3, said annealing step further comprising at least one of swapping locations of components of a same type that have associated grid sites, swapping two modules in a sequence pair, and switching the shape of a module from one shape in the set of shapes associated with that module to another.

5. The method of claim 1, said determining step further comprising:
    for each module, determining at least one of a plurality of shapes with consecutively increasing widths and decreasing heights or a plurality of shapes with consecutively decreasing widths and increasing heights; and
    for each module, adding each shape from the plurality of shapes with consecutively increasing widths and decreasing heights and the plurality of shapes with consecutively decreasing widths and increasing heights to the set of static shapes for the module when the shape conforms to a minimum size requirement.

6. The method of claim 3, further comprising:
    identifying modules that share a timing critical path; and
    moving identified modules closer to one another.

7. The method of claim 1, wherein the programmable logic device is a Field Programmable Gate Array.

8. The method of claim 1, wherein each shape of a set of shapes associated with a module has a minimum width and height of at least a width and height of a largest relatively placed macro to be placed within that module.

9. The method of claim 1, further comprising:
    generating a flat placement flow for the circuit design; and
    comparing the annealed circuit design with the flat placement flow to determine a measure of quality for the determined floorplan.

10. A system for designing a programmable logic device comprising:
    means for defining modules of a circuit design comprising components of a same type;
    means for determining a set of static shapes for each module prior to annealing the circuit design, wherein each shape of the set of static shapes for each module is sized so that utilization of sites within the shape by components of the module associated with the shape is less than a threshold utilization;
    means for annealing the circuit design to determine a floorplan comprising,
    means for, for each module during a first iteration of annealing, selecting a shape from the set of static shapes associated with the module and applying the selected shape to the module, and
    means for, for at least one module during at least one further iteration of annealing, selecting a different shape from the set of static shapes associated with the at least one module and applying the different shape to the at least one module, wherein each iteration of annealing the circuit design is evaluated according to evaluation of a cost function.

11. The system of claim 10, said means for defining further comprising means for splitting modules into sub-modules, wherein at least one of the sub-modules consists of components of a same type determining further comprising means for increasing a minimum number of sites of each shape of the set of static shapes for each module according to a scaling factor.

12. The system of claim 10, said means for annealing further comprising means for assigning modules and assigned shapes to locations on the physical device evaluating a cost function that depends upon a measure of weighted wire length and a percentage of total module area that is outside of the programmable logic device.

13. The system of claim 12, said means for annealing further comprising means for performing at least one of swapping locations of components of a same type that have associated grid sites, swapping two modules in a sequence pair, and switching the shape of a module from one shape in the set of shapes associated with that module to another.

14. The system of claim 10, wherein said means for determining further comprise:
    means for, for each module, determining at least one of a plurality of shapes with consecutively increasing widths and decreasing heights or a plurality of shapes with consecutively decreasing widths and increasing heights; and
    means for, for each module, adding each shape from the plurality of shapes with consecutively increasing widths and decreasing heights and the plurality of shapes with consecutively decreasing widths and increasing heights to the set of static shapes for the module when the shape conforms to a minimum size requirement.

15. The system of claim 12, further comprising:
    means for identifying modules that share a timing critical path; and
    means for moving identified modules closer to one another.

16. The system of claim 10, wherein the programmable logic device is a Field Programmable Gate Array.

17. The system of claim 10, wherein each shape of a set of shapes associated with a module has a minimum width and height of at least a width and height of a largest relatively placed macro to be placed within that module.

18. The system of claim 10, further comprising:
means for generating a flat placement flow for the circuit design; and
means for comparing the annealed circuit design with the flat placement flow to determine a measure of quality for the determined floorplan.

19. A machine readable storage, having stored thereon a computer program having a plurality of code sections executable by a machine for causing the machine to perform the steps of:
defining modules of a circuit design comprising components of a same type;
prior to annealing the circuit design, determining a set of static shapes for each module, wherein each shape of the set of static shapes for each module is sized so that utilization of sites within the shape by components of the module associated with the shape is less than a threshold utilization;
annealing the circuit design to determine a floorplan by, at least in part,
for each module during a first iteration of annealing, selecting a shape from the set of static shapes associated with the module and applying the selected shape to the module, and
for at least one module during at least one further iteration of annealing, selecting a different shape from the set of static shapes associated with the at least one module and applying the different shape to the at least one module, wherein each iteration of annealing the circuit design is evaluated according to evaluation of a cost function.

20. The machine readable storage of claim 19, said determining step further comprising increasing a minimum number of sites of each shape of the set of static shapes for each module according to a scaling factor.

21. The machine readable storage of claim 19, said annealing step further comprising evaluating a cost function that depends upon a measure of weighted wire length and a percentage of total module area that is outside of the programmable logic device.

22. The machine readable storage of claim 21, said annealing step further comprising at least one of swapping locations of components of a same type that have associated grid sites, swapping two modules in a sequence pair, and switching the shape of a module from one shape in the set of shapes associated with that module to another.

23. The machine readable storage of claim 19, said determining step further comprising:
for each module, determining at least one of a plurality of shapes with consecutively increasing widths and decreasing heights or a plurality of shapes with consecutively decreasing widths and increasing heights, and
for each module, adding each shape from the plurality of shapes with consecutively increasing widths and decreasing heights and the plurality of shapes with consecutively decreasing widths and increasing heights to the set of static shapes for the module when the shape conforms to a minimum size requirement.

24. The machine readable storage of claim 21, further comprising:
identifying modules that share a timing critical path; and
moving identified modules closer to one another.

25. The machine readable storage of claim 19, wherein the programmable logic device is a Field Programmable Gate Array.

26. The machine readable storage of claim 19, wherein each shape of a set of shapes associated with a module has a minimum width and height of at least a width and height of a largest relatively placed macro to be placed within that module.

27. The machine readable storage of claim 19, further comprising:
generating a flat placement flow for the circuit design; and
comparing the annealed circuit design with the flat placement flow to determine a measure of quality for the determined floorplan.

* * * * *